United States Patent [19]

Lauf

[11] Patent Number: 5,503,898

[45] Date of Patent: Apr. 2, 1996

[54] METHOD FOR PRODUCING TEXTURED SUBSTRATES FOR THIN-FILM PHOTOVOLTAIC CELLS

[75] Inventor: Robert J. Lauf, Oak Ridge, Tenn.

[73] Assignee: Martin Marietta Energy Systems, Inc., Oak Ridge, Tenn.

[21] Appl. No.: 229,944

[22] Filed: Apr. 19, 1994

Related U.S. Application Data

[62] Division of Ser. No. 996,328, Dec. 23, 1992, Pat. No. 5,306,646.

[51] Int. Cl.⁶ .................................................. H01L 31/04
[52] U.S. Cl. ........................ 428/149; 136/256; 136/258; 136/259
[58] Field of Search .................................. 428/141, 143, 428/149; 136/256, 258 AM, 259; 427/74; 264/61, 62, 63; 437/2, 4, 5

[56] References Cited

U.S. PATENT DOCUMENTS

| | | | |
|---|---|---|---|
| 2,966,719 | 1/1961 | Park, Jr. | 264/63 |
| 3,854,186 | 12/1974 | Sergeys | 264/63 |
| 4,379,109 | 4/1983 | Simpson | 264/60 |
| 4,514,582 | 4/1985 | Tiedje et al. | 136/256 |
| 4,514,583 | 4/1985 | Izu et al. | 136/259 |
| 5,306,646 | 4/1994 | Lauf | 437/2 |

OTHER PUBLICATIONS

Jap. Pat Abst. 58–61678(A), Apr. 1983.
Jap. Pat. Abst. 61–284,970(A), Dec., 1986.
Jap. Pat. Abst. 59–119,878(A), Jul., 1984.
DE 3446807(A) Pat. Abst., Jul., 1986.

*Primary Examiner*—Jenna L. Davis
*Attorney, Agent, or Firm*—E. L. Larcher; G. L. Craig; H. W. Adams

[57] ABSTRACT

The invention pertains to the production of ceramic substrates used in the manufacture of thin-film photovoltaic cells used for directly converting solar energy to electrical energy. Elongated ribbon-like sheets of substrate precursor containing a mixture of ceramic particulates, a binder, and a plasticizer are formed and then while green provided with a mechanically textured surface region used for supporting the thin film semiconductor of the photovoltaic cell when the sheets of the substrate precursor are subsequently cut into substrate-sized shapes and then sintered. The textured surface pattern on the substrate provides enhanced light trapping and collection for substantially increasing the solar energy conversion efficiency of thin-film photovoltaic cells.

2 Claims, 2 Drawing Sheets

METHOD FOR PRODUCING TEXTURED SUBSTRATES FOR THIN-FILM PHOTOVOLTAIC CELLS

This invention was made with the support of the United States Government under contract No. DE-AC05-84OR21400 awarded by the U.S. Department of Energy. The United States Government has certain rights in this invention.

This application is a division of application No. 07/996,328 filed Dec. 23, 1992, now U.S. Pat. No. 5/306,646.

BACKGROUND OF THE INVENTION

The present invention relates generally to the production of substrates used in the manufacture of thin-film photovoltaic cells wherein a thin film of solar energy converting semiconducting material is supported on the substrate, and more particularly to the production of such substrates during which the substrates are provided with surface texturing for promoting light capturing and reflecting properties of the substrates.

Increasing-concerns for the environment and the substantial reliance on exhaustible energy resources for supplying the energy needs of the world have been largely responsible for the increased efforts in developing alternative energy sources. For example, considerable research is being conducted in developing systems for converting solar energy into useful energy forms such as electricity. Notably, the conversion of solar energy directly to electrical energy in an environmentally nonpolluting manner has been achieved through the use of photovoltaics or solar cells.

Generally, the production of electrical energy in photovoltaic cells is provided by utilizing amorphous or crystalline semiconducting materials which possess solid state characteristics capable of efficiently converting solar energy or photons into electrical energy. Such semiconducting materials include silicon doped with suitable impurities such as aluminum, copper, chromium, phosphorous and boron to provide N-type and/or P-type junctions and to a lesser extent because of relative cost, semiconducting materials such as cadmium sulfide, cadmium telluride, amorphous silicon-hydrogen, germanium, and gallium arsenide. Of the types of photovoltaic cells as presently known, the so-called thin-film photovoltaic cells which utilize a relatively thin layer or film of a suitable semiconducting material of a thickness less than about 200 microns deposited on a supporting substrate are presently generating the most interest. It has been observed that available thin-film photovoltaic cells already possess solar energy conversion efficiencies at least as great as the well known and relatively expensive solar cells formed of a single crystal and that developments in thin-film photovoltaic technology are expected to provide even greater improvements in cost efficiency and solar energy conversion efficiency.

In the fabrication of thin-film photovoltaic cells, the solar energy converting semiconducting material is deposited onto a surface region of a substrate by a suitable deposition technique such as chemical vapor deposition as a film with a thickness in the range of about 50 to 200 micrometers. The selection of the substrate material and providing the substrate with desirable physical properties are of significant importance in the manufacture of efficient thin-film photovoltaic cells at economically acceptable costs. The substrate is required to be made of a material which forms a non-rectifying contact of relatively low electrical resistance with the deposited film of semiconducting material. The substrate is also required to provide an adequate structural support for the film to maintain the integrity thereof and provide a tenacious physical bond with the deposited film. Further, the substrate must possess a coefficient of thermal expansion substantially corresponding to that of the deposited film in order to minimize deleterious stresses which may occur therebetween during exposure of the thin-film photovoltaic cell to temperature variations.

Satisfactory substrates for thin-film photovoltaic cell applications have been formed of sintered ceramic materials such as alumina, silica, silicon carbide, mullite, cordierite, zirconia or mixtures thereof and possess a coefficient of thermal expansion sufficiently close to that of the deposited thin films of the semiconducting materials so as to provide a structural support for the thin films when the thin-film photovoltaic cells are subjected to a wide range of temperatures. Also, these ceramic materials provide an adequate physical bond with the deposited thin film and possess electrical properties required of the substrate. The use of a substrate formed of relatively inexpensive materials is an important consideration from the standpoint of cost efficiency in the use of photovoltaic cells as a viable alternative energy source.

When generating electricity with thin-film photovoltaic cells, a substantial percentage of the photons pass through the thin film without being utilized in the electrical energy producing process occurring within the film. Thus, in order to increase the solar conversion efficiency of thin-film photovoltaic cells, a mechanism must be provided for increasing light trapping within the cells so that photons passing through the thin film can be collected and reflected back into the thin film for use in the energy conversion process. To this end, it has been found that the enhancement of the light trapping and collecting of the thin-film photovoltaics can be successfully provided by using thin film dielectric reflectors or by providing the surface of the substrate supporting the thin film with light reflecting properties.

Previous efforts-utilized in providing the substrate with light reflecting properties included forming the substrate in such a manner as to have a toughened film supporting surface to collect and reflect the photons passing through the thin film back into the film. This "texturizing" of the substrate has been provided by forming the substrate from a sintered blend of ceramic particulates provided by a relatively large size fraction of particulates and a relatively small size fraction of particulates. However, it was found that the formation of the substrate in such a manner had a considerable impact on the structural integrity of the substrate since such substrates were relatively friable and thus lacked the desired structural strength needed for supporting the thin film of semiconducting material, especially when employed in relatively thin cross sections such as required for maintaining a cost efficient production of thin-film photovoltaic cells. Also, some texturing of the substrate surface has been achieved by mechanically roughening the surface of the sintered ceramic materials in order to increase the light-trapping properties of the substrate. This mechanical roughening of a surface on sintered ceramic substrates is relatively expensive, substantially nonreproducible and also considerably increases the cost of the substrates employed in the manufacture of thin-film photovoltaic cells.

SUMMARY OF THE INVENTION

Accordingly, it is a principal aim or objective of the present invention to produce in a cost efficient manner surface-textured substrates of sintered ceramic particulates for structurally supporting thin films of semiconductors employed in the manufacture of thin-film photovoltaic cells whereby the surface texturing substantially enhances the light-trapping properties of the substrate to significantly increase the solar energy conversion efficiency of the thin-film photovoltaic cells. Generally, in the manufacture of thin-film photovoltaic cells, a film of semiconductor material is deposited on a surface region of a substrate formed of sintered particulates of a ceramic material having relatively low resistance and non-rectifying properties. The method of the present invention is directed to the production of such substrates in a preselected configuration with the surface region of the substrate supporting the film of semiconductor material being provided with a light-reflecting textured pattern at a time prior to the sintering of the ceramic particulates. This method comprises the steps of forming a mixture including the ceramic particulates; a relatively volatile binder and a relatively volatile plasticizer; mechanically forming the mixture into an elongated ribbon or sheet means having opposite first and second planar surfaces; and then contacting the first planar surface of the sheet means with a patterned surface of a mechanical means for embedding the pattern of the patterned surface in the first planar surface of the sheet means to provide the green, i.e., non-sintered, substrate with a textured surface region. The binder and the plasticizer are respectively employed in the substrate forming mixture in a concentration adequate for maintaining the ceramic particulates together in the shape of the mechanically formed sheet means and in a concentration adequate for providing the mechanically formed sheet means with plastic properties for receiving and maintaining the patterned surface embedded therein.

The patterned surface on the mechanical means is an embossed pattern selected to sufficiently provide the first planar surface of the sheet means with sufficient surface disruption or texturing for enabling the patterned surface of the substrate to reflect light therefrom into the thin film of the semiconductor material supported thereon. This embossed pattern on the mechanical means is preferably in the form of parallel grooves, individual sets of parallel grooves disposed at angles to one another or individual protuberances for forming a stippled pattern on the first planar surface region.

Another object of the present invention is to form such elongated sheet of ceramic material by using a tape casting process or a roll compaction process. When using the tape-casting process a volatile solvent for the binder and/or the plasticizer is added to the sheet forming mixture in a concentration adequate to render the mixture of a sufficient liquid-like viscosity for casting the mixture into the desired sheet form. Binders and plasticizers are also incorporated in the mixture used for forming the sheet by the roll compaction process to provide the mixture with an adequate green strength, flexibility, and density.

Another object of the present invention is to provide for the formation of the planar sheet of the green substrate and the displacement of the green substrate past the patterned surface of the mechanical means in a continuous manner so as to provide a textured green substrate of a size adequate to provide a plurality of sintered substrates usable in the manufacture of thin-film photovoltaic cells.

A further object of the present invention is to provide for such texturing of the planar sheet means by employing roller means having an embossed surface for embedding the pattern of the embossed surface in the surface of the sheet means as it is contacted by the roller means.

A further object of the present invention is to provide a take-up reel or spool for receiving and storing the surface-textured green substrate prior to the subsequent sizing thereof into selected substrate configurations followed by the sintering of the particulate material in the substrate to provide relatively rigid substrates in generally wafer form that incorporate the textured surface provided by the texturing of the green substrate.

A still further object of the present invention is to provide a diffusion barrier on the textured surface of the sintered substrate for inhibiting diffusion of the semiconducting material forming the film into the substrate or the contamination of the film by the substrate material.

A still further object of the present invention is to provide a surface-textured substrate precursor and at least one surface-textured substrate therefrom for thin-film photovoltaic applications as produced by the method of the present invention.

Other and further objects of the present invention will become obvious upon an understanding of the illustrative method about to be described or will be indicated in the appended claims, and various advantages not referred to herein will occur to one skilled in the art upon employment of the invention in practice.

Figure 1:
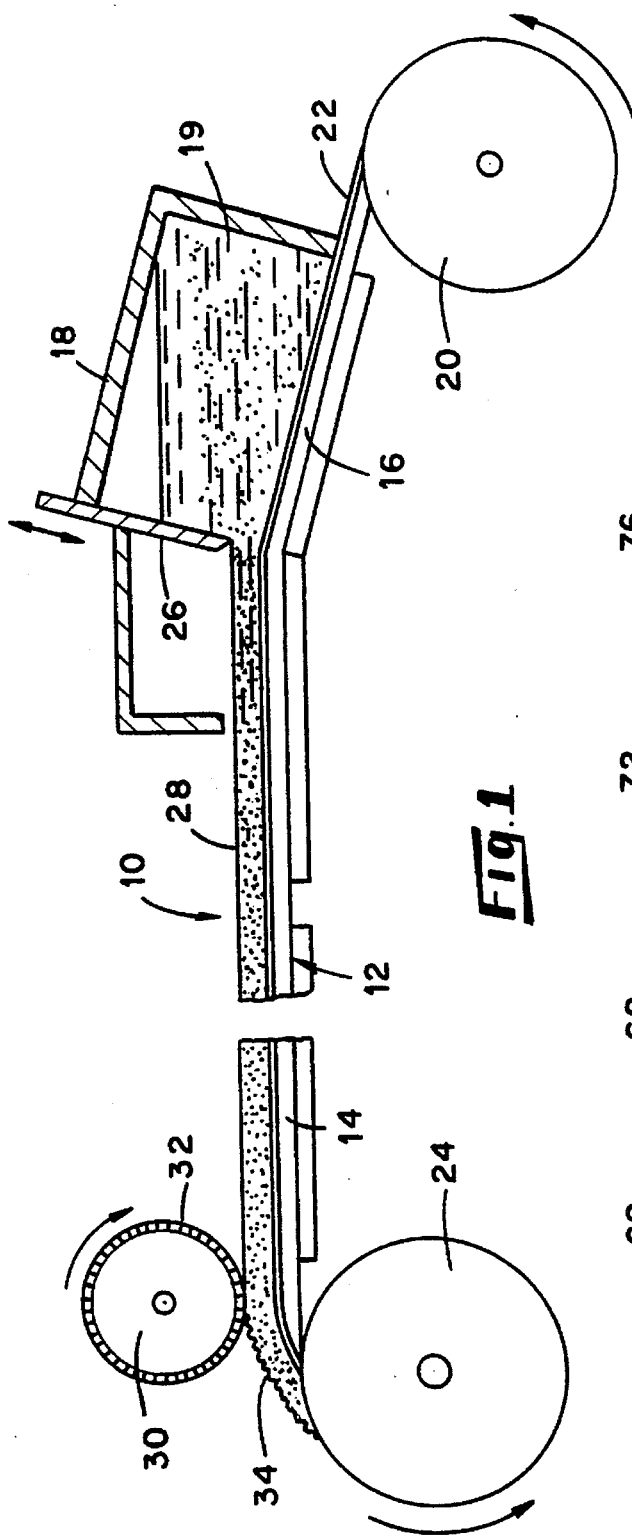
FIG. 1 is a schematic elevational view of a tape casting assembly used for tape casting a planar ribbon or sheet of the substrate material and modified by including a roller arrangement having an embossed surface for texturing a surface region of the planar sheet for enhancing the light trapping and light collecting properties of substrates prepared therefrom and used in thin-film photovoltaic cells.

Preferred embodiments of the invention have been chosen for the purpose of illustration and description. The preferred embodiments illustrated are not intended to be exhaustive nor to limit the invention to the precise forms shown. The preferred embodiments are chosen and described in order to best explain the principles of the invention and their application and practical use to thereby enable others skilled in the art to best utilize the invention in various embodiments and modifications as are best adapted to the particular use contemplated.

DETAILED DESCRIPTION OF THE INVENTION

The present invention is directed to the production of surface-textured substrates to be utilized in the manufacture of thin-film photovoltaic cells useful for directly converting solar energy into electrical energy. As briefly described above, thin-film photovoltaic cells generally comprise a solar energy converting film of a semiconducting material of any suitable type such as described above that has been deposited on a supporting substrate by a suitable film forming process such as chemical vapor deposition or the like to a thickness in the range of about 50 to 200 micrometers. Preferably, the substrate is provided by a sized wafer of sintered ceramic material which structurally supports the thin film and is characterized by relatively low electrical resistance and the capability of providing a non-rectifying contact with the thin film of semiconducting material. Also, the wafer of ceramic material is required to possess a coefficient of thermal expansion substantially corresponding to that of the film of the selected semiconducting material. For providing such substrates ceramic materials such as silica, silicon carbide, alumina, corderite, mullite, or mixtures thereof are considered to be suitable candidates since these ceramic materials possess the physical properties desired of the substrate and are also relatively inexpensive as compared to other ceramic materials which may be used as the substrates in thin-film photovoltaic cells. Thus, while the present invention preferably utilizes such relatively inexpensive ceramic materials for the formation of the substrates, it is to be understood that the present invention is not limited to the formation of the substrates from these ceramic materials since the method of this invention can be used for producing substrates from any suitable sinterable ceramic material.

Substrates of the selected ceramic material in wafer form or any other suitable configuration can be readily provided by sintering together particulates of the selected ceramic material in a particle size range of about 0 to 10 micrometers at a temperature in a range of about 1000° to 1500° C.

In accordance with the present invention, elongated planar ribbons or sheets of the selected particulate ceramic material are produced and provided with a textured surface suitable for reflecting light back into the thin film. These planar sheets or substrate precursors are cut into a selected substrate form, such as that of a wafer, of a selected size and then sintered to provide surface-textured substrates useful in the manufacture of thin-film photovoltaic cells in a highly cost efficient and reproducible manner. Elongated flexible and plastic sheets of the textured substrate in green or precursor form, i.e., non-sintered, are prepared from a mixture of ceramic particulates, a suitable organic binder for holding the ceramic particulates together in the surface textured sheet form until the sintering operation and a suitable plasticizer for providing the green sheets with the desired flexible and plastic properties for receiving and retaining a pattern embedded in a surface region thereof. This mixture plus a relatively volatile solvent for the binder and/or the plasticizer can be readily shaped into the planar sheet form by using a conventional tape-casting assembly that has been modified to incorporate a substrate surface texturing mechanism as illustrated in FIG. 1.

Figure 2:
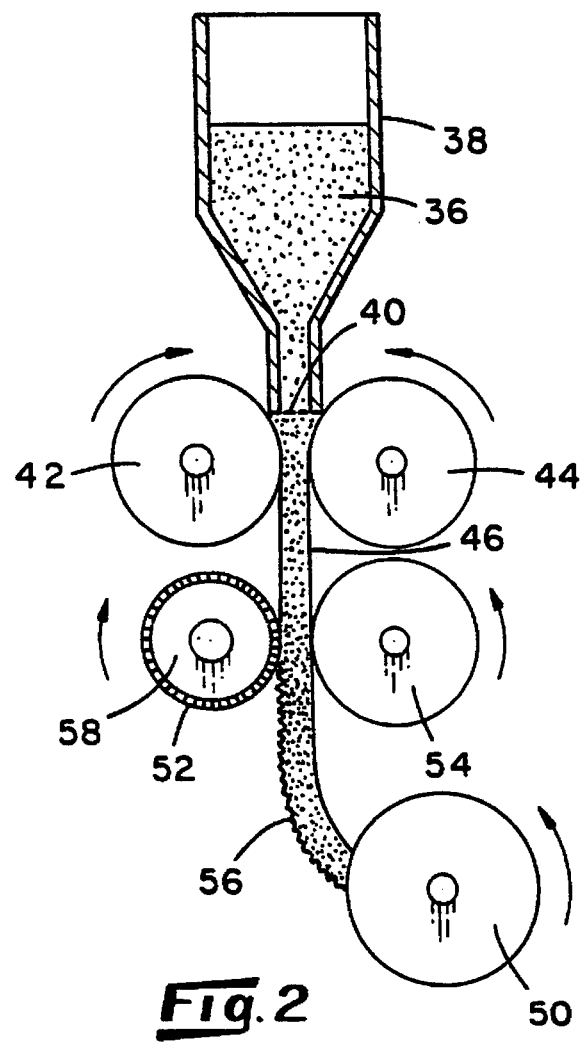
FIG. 2 is a schematic elevational view of an alternative embodiment of an assembly utilized for forming a planar ribbon or sheet of the substrate precursor by roll compaction and includes a roller assembly having a roller with an embossed surface for providing a textured surface on a surface region of the sheet for enhancing the light trapping and collecting properties of substrates prepared therefrom and used in thin-film photovoltaic cells.

Alternatively, the mixture, which may also include relatively little or no solvent, can be shaped in the planar sheet form by employing a roll compaction assembly which includes sheet forming rollers and which is fitted with a surface texturing mechanism as illustrated in FIG. 2.

As shown in FIG. 1, the tape-casting assembly 10 generally comprises a metal support platform 12 having a horizontal section 14 and an angled or slanted section 16. A reservoir 18 is supported on the angled section 16 of the platform 12 and is shown containing a quantity of liquid slip 19 formed of a mixture of the ceramic particulates, the organic binder, the organic plasticizer, and a suitable quantity of a solvent for the binder and/or the plasticizer for providing the mixture with liquid-like properties. Suitable binders, plasticizers, and solvents for this tape-casting and surface-texturing process are set forth below. A spool 20 containing a supply of a suitable plastic film 22 such as polyethylene terephthalate resin sold under the trademark "Mylar" of a thickness in the range of about 0.0001 to 0.005 inch is supported at the distal or free end of the angled section 16 for supplying the film used in the tape casting operation. This film 22 is extended over the upper surface of the platform 12 through the base of the reservoir 18 to a take-up reel or spool 24 supported at the end of the horizontal section 14.

In the tape-casting operation a selected portion of the liquid slip 19 used for forming the substrate precursor is removed from the reservoir 18 by the moving film 22 and passed under a vertically movable doctor blade 26 which is used to provide cast slip with the desired thickness in the form of an elongated planar ribbon or sheet 28 as the film 22 is continually displaced along the platform 12 by the action of the take-up spool 24. As the cast sheet 28 is displaced over the length of the horizontal section 14 of the platform the solvent in the mixture volatilizes so that the mixture forming the casting becomes increasingly more viscus until it reaches an essentially "solid" state near the take-up spool 24. In this solid state the casting of the planar sheet 28 still contains the less volatile binder and plasticizer so as to possess properties which render it flexible and sufficiently plastic to receive and retain surface texturing patterns provided by a surface-texturing roll 30 placed near and over an end portion of the horizontal section 14 of the platform 12. This surface-texturing roll 30 is provided with an embossed surface 32 which bears against the upper surface of the green substrate sheet 28 as it passes under the roll 30 onto the take-up spool 24 so that the pattern of the embossed surface 32 is embedded into the upper surface of the sheet 28 to provide the latter with a textured surface 34. The texturing roll 30 preferably imposes pressure loading of about 5,000 to 30,000 psi on the surface of the sheet 28 to effect the formation of the textured surface 34.

The green substrate sheet 28 containing the textured surface 34 is stored on the take-up spool 24 until such time it is desired to form substrate shapes or forms from the sheet 28. To this end, the sheet 28 is removed from the spool 24 and cut into forms desired of the substrate. These substrate forms are then subjected to a sintering operation at a selected temperature in the aforementioned temperature range. Such heating of the substrate shapes is adequate for volatilizing the binder and the plasticizer and adequate for providing a finished substrate of the sintered ceramic particulates with the desired textured surface on the substrate. However, if desired the substrate forms may be initially heated to a temperature lower than the ceramic particulate sintering temperature in flowing gas or vacuum for removing the volatile binder and plasticizer from the substrate forms.

The liquid slip used for forming the sheet 28 defining the substrate precursor contains about 70 to 90 wt % of ceramic particulates in the aforementioned particle size range; about 5 to 10 wt % of an organic binder such as acrylic resin, polyvinyl acetate, polyvinyl butyral, ethyl cellulose, or the like, and combinations thereof; about 1 to 5 wt % of an organic plasticizer such as polyethylene glycol, octyl phthalate, or the like, and combinations thereof; and a volatile solvent for the binder and/or the plasticizer such as hexane, an alcohol such as ethanol, a ketone, or combinations thereof toluene, trichloroethylene, or ethanol. The concentration of the solvent in the mixture can be selectively varied so as to render the mixture sufficiently liquid so that it is capable of readily flowing from the reservoir 18 onto the moving film 22 for forming the planar sheet 28 of the substrate precursor. Normally about 10 to 30 wt % of the solvent is adequate to provide the slip with the desired liquid properties. Further, if desired a dispersant such as menhaden oil, glycerol trioleate, or other organic fatty acids may be used in the mixture for assuring uniform distribution of the ceramic particulates throughout the liquid slip.

The tape casting assembly 10 as modified in accordance with the present invention is suitable for providing sheets of surface-textured substrate precursors of any suitable dimensions such as sheets having widths in the range of about 1 to 12 inches, a thickness in the range of about 0.005 to 0.060 inch, and of a length of about 0.5 inch to about 36 inches which is sufficient to provide at least one and preferably a substantial plurality of substrate wafers. Depending upon the size of the take-up rolls, planar sheets of the substrate precursor may be prepared in lengths extending up to several feet.

FIG. 2 illustrates an alternate embodiment of an assembly for forming the planar sheets of the substrate precursor. In this embodiment, a substantially dry, flowable powder mixture used for forming the green substrate sheets is provided by about 80 to 90 wt % ceramic particulates of the desired particle size, about 10 to 20 wt % of the binder, and about 0 to 5 wt % of the plasticizer. The binder and plasticizer are described above. The mixture 36 is shown contained in a vessel or housing 38 provided with a rectangular slot 40, preferably at the base thereof, through which a selected quantity of the mixture 36 is gravity fed from the vessel 38 and compacted by the rolls 42 and 44 to form a continuous sheet 46. The mixture 36 as it is discharged from the vessel 38 is passed between rolls 42 and 44 which compact the mixture 36 into the sheet 46 by applying a pressure loading of about 10,000 to 30,000 psi on the powder mixture 36 to densify the mixture and thereby form a green substrate sheet 46 which has the desired flexibility and the structural integrity required of the sheet 46 so that it may be taken up on a take-up spool 50 supported by the sheet forming assembly at a suitable location such as shown vertically spaced from and underlying the rollers 42 and 44. After the sheet 46 is formed by the rolls 42 and 44, the flexible and plastic sheet 46 is passed between rollers 52 and 54 for providing the desired textured pattern 56 on a surface region of the substrate precursor or sheet 46. In order to provide this textured pattern 56 on the sheet 46, the roll 52 is shown provided with a textured or embossed surface 58 which contacts the surface of the plastic, roll-formed sheet 46 to embed the pattern of the embossed surface 58 into the surface of the sheet 46 and thereby provide the sheet 46 with the textured surface pattern 56 prior to its being received on the take-up spool 50.

After fabricating an elongated sheet 46 of green substrate by employing the assembly of FIG. 2, selected lengths of the sheet 46 may be removed from the take-up spool 50 and cut into wafers or other substrate form desired for the substrates used in thin-film photovoltaic cells. This cutting of the green sheet 46 as well as the green sheet 28 described above is achieved in a relatively easy manner since the cutting of the sheets 46 or 28 into substrate forms is achieved at a time prior to the sintering operation. Upon the formation of the green substrate wafers, they are subjected to the sintering operation as generally described above for completing the formation of the substrate.

Figure 3:
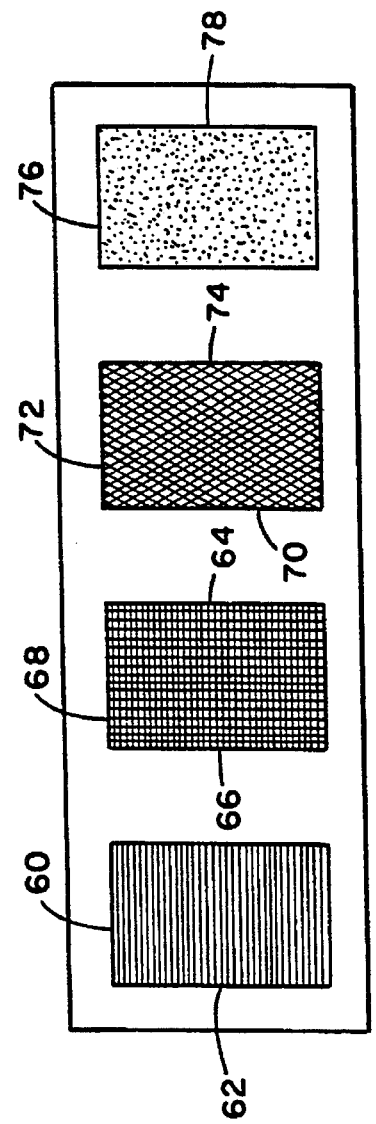
FIG. 3 is a plan view illustrating a plurality of sintered substrate wafers prepared from the substrate precursors produced by the method of the present invention and usable in the fabrication of thin-film photovoltaic cells with each of these wafers being provided with a film-supporting textured surface of a selected pattern for providing the light trapping and light collecting properties of the substrates in thin-film photovoltaic cells.

In FIG. 3 several examples of sintered ceramic substrates in wafer form with surface texturing patterns are illustrated to show the flexibility of the process of the present invention for providing any desired surface texturing pattern on the substrates and thereby permitting the substrates to be readily tailored to provide the type and the extent of light trapping and light collection desired of the substrates. Such tailoring can be used for significantly increasing the solar energy conversion efficiency of thin-film photovoltaic cells employed under different environmental conditions. For example, in FIG. 3 the substrate 60 is shown provided with elongated, parallel grooves 62; the substrate 64 is shown provided with two sets of elongated, parallel grooves 66 and 68 disposed at 90° to one another for providing a textured surface of a generally square or rectangular pattern; the substrate 70 is shown provided with two sets of elongated, parallel grooves 72 and 74 disposed at angles to one another for forming a generally diamond-shaped texture on the surface of the substrate 70; and the substrate 76 is shown with a stipple-like texture 78 generally corresponding to that of coarse sandpaper. The surface texturing patterns provided by the present invention preferably provides surface features on the substrate defined by indentations or peaks disposed or inclined at angles of about 30° to 60° to the planar surface of the substrate and of a depth or height in the range of about 50 to 100 micrometers. By employing such angled surface patterns, light is reflected from the substrate surface back into the thin film of semiconductor material for significantly increasing the solar energy conversion efficiency of thin-film photovoltaic cells using film-supporting substrates prepared in accordance with the present invention.

Figure 4:
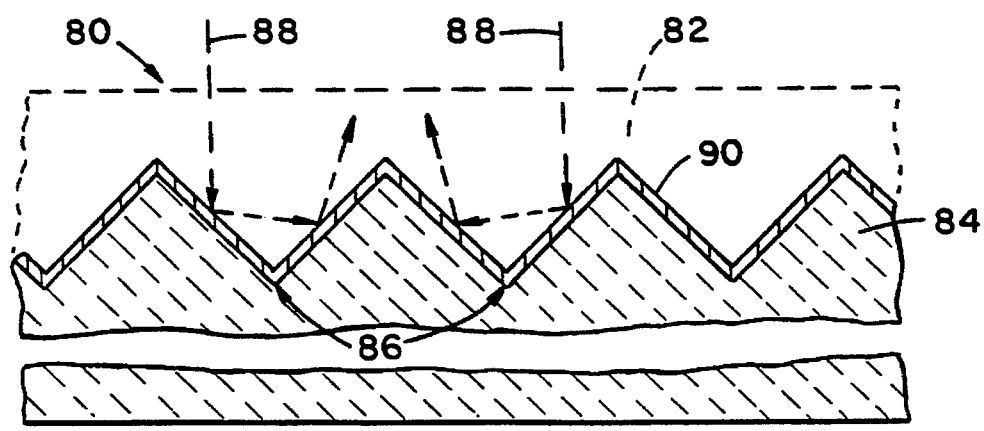
FIG. 4 is an elevational, sectional view generally illustrating a thin-film photovoltaic cell in which a thin film of semiconducting material is deposited on a substrate having a surface textured in accordance with the present invention and provided with the diffusion barrier positioned between the thin film and the textured surface.

With reference to FIG. 4, a thin-film photovoltaic cell is generally illustrated at 80 with the thin film 82 of a desired semiconducting material deposited on a substrate 84 provided with surface texturing defined by angled parallel grooves 86. As shown the grooves 86 penetrate the planar surface of the substrate 84 at angles of about 45° thereto so as to internally reflect the photons generally shown at 88 that have passed through the thin film 82 back into the film 82 for efficiently utilizing the available light energy in the solar energy conversion process by effectively increasing the path length within the thin film 82 of semiconducting material. Also, as shown in FIG. 4 a diffusion barrier 90 is deposited on the textured surface of the substrate 84 to inhibit diffusion of the thin film material into the surface of the substrate 84 during the formation of the film 82 or the contamination of the thin film 82 by material in the substrate 84. This diffusion barrier 90 may be formed of any suitable inert material capable of providing a diffusion barrier such as titanium nitride, tantalum nitride, hafnium nitride, zirconium nitride, or other refractory metal carbides, nitrides, or borides, or mixtures thereof. The diffusion barrier 90 may be of any suitable thickness which is sufficient to prevent the aforementioned diffusion and film contamination problems. Diffusion barriers of a thickness in the range of about 30 to 200 micrometers when formed of the above materials provide a suitable diffusion barrier. The diffusion barrier 90 may be readily applied to the surface of the sintered substrate 84 by using any suitable deposition process such as chemical vapor deposition, rf magnetron sputtering, evaporation, or the like.

The particular material selected for forming the diffusion barrier 90 can provide additional benefits. For example, one of the preferred materials for forming the diffusion barrier 90 is titanium nitride which has relatively high optical reflectivity for enhancing the light trapping by the mechanism shown in FIG. 4. Several of the preferred materials for forming the diffusion barrier 90 have sufficient electrical conductivity to serve as the rear electrodes in the photovoltaic cell so as to simplify cell fabrication and interconnections.

It will be seen that the present invention provides a cost efficient process for the production of surface-textured Ceramic substrates suitable for use in the manufacture of thin-film photovoltaic cells. The surface textured substrates provided by practicing the present invention significantly enhance light trapping and light collection and render the manufacture and the use of photovoltaic cells more economically feasible than achievable by employing previously utilized surface-textured or smooth substrates in such applications.

What is claimed is:

1. A thin-film photovoltaic cell comprising a thin-film of semiconductor material supported on a surface of a surface-textured ceramic substrate, said thin-film photovoltaic cell produced by the method comprising the steps of forming a mixture including ceramic particulates, a volatile binder and a volatile plasticizer, mechanically forming the mixture into a sheet having opposite first and second planar surfaces, contacting the first planar surface of the sheet with a patterned surface of a mechanical means for embossing in the first planar surface of the sheet the pattern of the patterned surface and thereby providing the first planar surface with a textured light-reflecting surface pattern, said binder being in the mixture in a concentration adequate for maintaining the ceramic particulates together in the form of the mechanically formed sheet and said plasticizer being in the mixture in a concentration adequate for providing the mechanically configured sheet with sufficient plasticity to receive and retain the pattern embossed in the first planar surface, heating the configuration to a temperature adequate to first volatilize the binder and the plasticizer and then adequate to sinter together the ceramic particulates for forming the ceramic substrate, and thereafter depositing a film of semiconductor material on said first planar surface of said substrate whereby light passing through the deposited film of semiconductor material is collected and reflected by the textured surface pattern of said substrate back into the deposited film of semiconductor material.

2. The thin-film photovoltaic cell of claim 1, wherein said method further includes the step of sizing at least a portion of the sheet with the textured surface pattern into a configuration desired of the substrate prior to the step of sintering together the ceramic particulates for forming the substrate.

* * * * *